(12) United States Patent
Tseng

(10) Patent No.: US 11,968,831 B2
(45) Date of Patent: Apr. 23, 2024

(54) MANUFACTURING METHOD OF MEMORY DEVICE

(71) Applicant: MACRONIX INTERNATIONAL CO., LTD., Hsinchu (TW)

(72) Inventor: Be-Shan Tseng, Tainan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 92 days.

(21) Appl. No.: 17/931,929

(22) Filed: Sep. 14, 2022

(65) Prior Publication Data

US 2023/0005951 A1  Jan. 5, 2023

Related U.S. Application Data

(62) Division of application No. 17/088,650, filed on Nov. 4, 2020, now Pat. No. 11,476,271.

(51) Int. Cl.
*H10B 43/20* (2023.01)
*H10B 41/35* (2023.01)
*H10B 41/41* (2023.01)
*H10B 43/10* (2023.01)

(52) U.S. Cl.
CPC .......... *H10B 43/20* (2023.02); *H10B 41/35* (2023.02); *H10B 41/41* (2023.02); *H10B 43/10* (2023.02)

(58) Field of Classification Search
CPC ........ H01L 27/11578; H01L 27/11524; H01L 27/11529; H01L 27/11565; H01L 27/088; H01L 21/823418; H01L 21/823487; H01L 29/0847; H01L 29/084; H10B 43/20; H10B 41/35; H10B 41/41; H10B 43/10; H10B 43/27; H10B 41/27; H10B 99/00; H10B 43/02

See application file for complete search history.

(56) References Cited

U.S. PATENT DOCUMENTS

| | | | |
|---|---|---|---|
| 7,566,620 B2 * | 7/2009 | Abbott | H10B 12/34 257/296 |
| 9,343,475 B2 * | 5/2016 | Jang | H01L 29/40117 |
| 10,164,009 B1 | 12/2018 | Carlson | |

(Continued)

FOREIGN PATENT DOCUMENTS

| TW | 201830669 A | 8/2018 |
|---|---|---|
| TW | I631692 B | 8/2018 |

(Continued)

*Primary Examiner* — Shahed Ahmed
*Assistant Examiner* — Khatib A Rahman
(74) *Attorney, Agent, or Firm* — McClure, Qualey & Rodack, LLP

(57) ABSTRACT

A memory device includes a substrate, a first dielectric structure, a second dielectric structure, a channel structure, a source structure, and a drain structure. The first dielectric structure and the second dielectric structure are disposed on the substrate, and are spaced apart from each other in a first direction. The channel structure interconnects the first dielectric structure and the second dielectric structure. The source structure and the drain structure are on opposite ends of the channel structure, and are respectively embedded in the first dielectric structure and the second dielectric structure, wherein a ratio in length along the first direction of the source structure to the first dielectric structure is between 0.3 and 0.4.

20 Claims, 15 Drawing Sheets

(56) References Cited

U.S. PATENT DOCUMENTS

| | | |
|---|---|---|
| 10,403,637 B2 | 9/2019 | Lue |
| 10,790,303 B2 * | 9/2020 | Kim .................... H01L 29/1037 |
| 10,804,283 B2 | 10/2020 | He et al. |
| 11,107,830 B2 * | 8/2021 | Kim .................... H01L 21/0217 |
| 2016/0071873 A1 * | 3/2016 | Tsuji ................. H01L 29/66833 |
| | | 438/269 |
| 2016/0181269 A1 * | 6/2016 | Lai ....................... H10B 63/845 |
| | | 257/326 |
| 2017/0141122 A1 * | 5/2017 | Yoshimizu ............. H10B 43/50 |
| 2018/0182776 A1 * | 6/2018 | Kim .................. H01L 29/66833 |
| 2018/0211969 A1 * | 7/2018 | Lue ................... H01L 21/76877 |
| 2019/0312952 A1 * | 10/2019 | Lee ......................... G06F 9/455 |
| 2022/0005823 A1 * | 1/2022 | Greenlee ................ H10B 43/27 |
| 2022/0085070 A1 * | 3/2022 | Yin ........................ H10B 51/20 |

FOREIGN PATENT DOCUMENTS

| | | |
|---|---|---|
| TW | I658573 B | 5/2019 |
| TW | I686922 B | 3/2020 |

\* cited by examiner

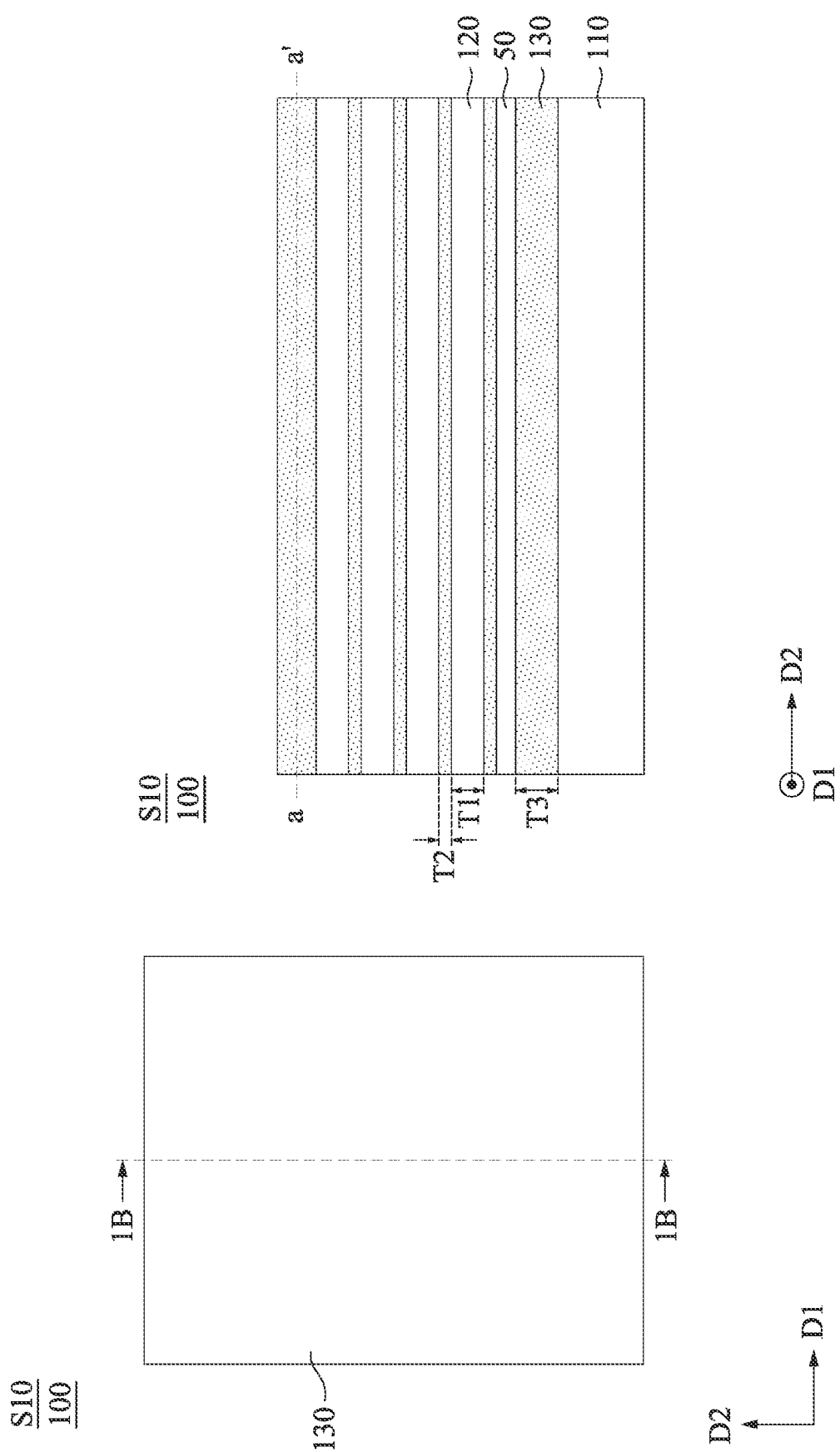

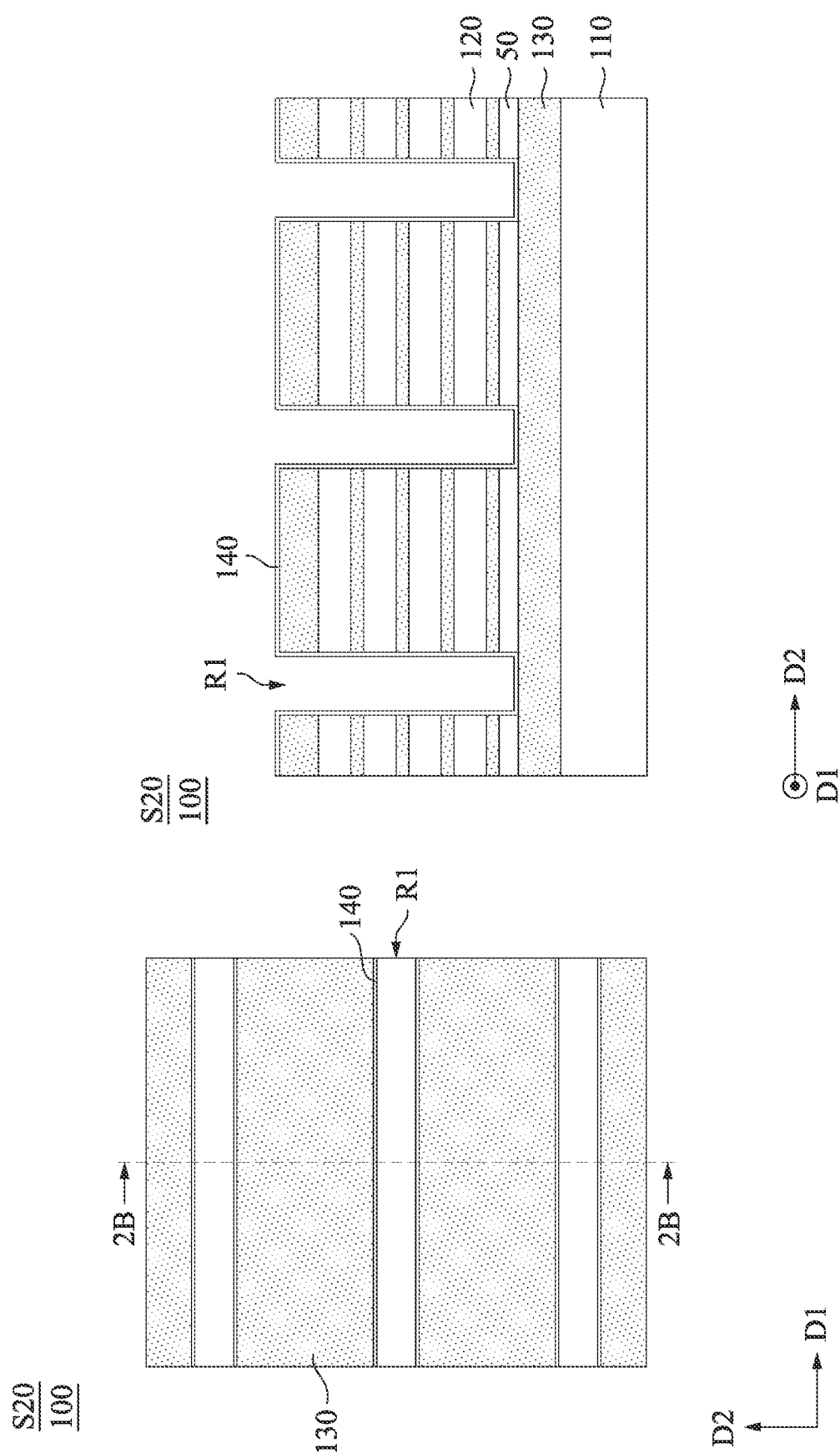

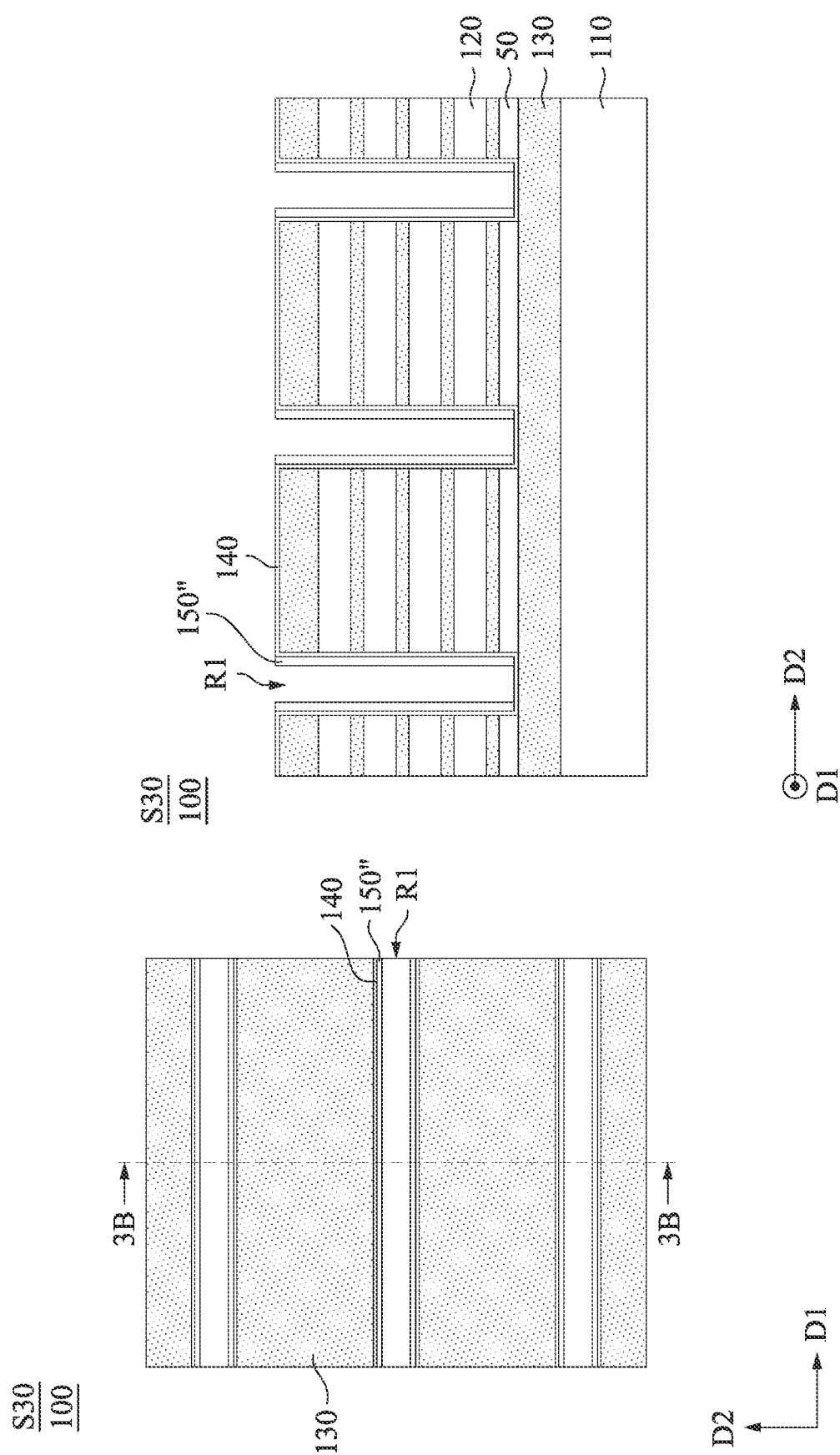

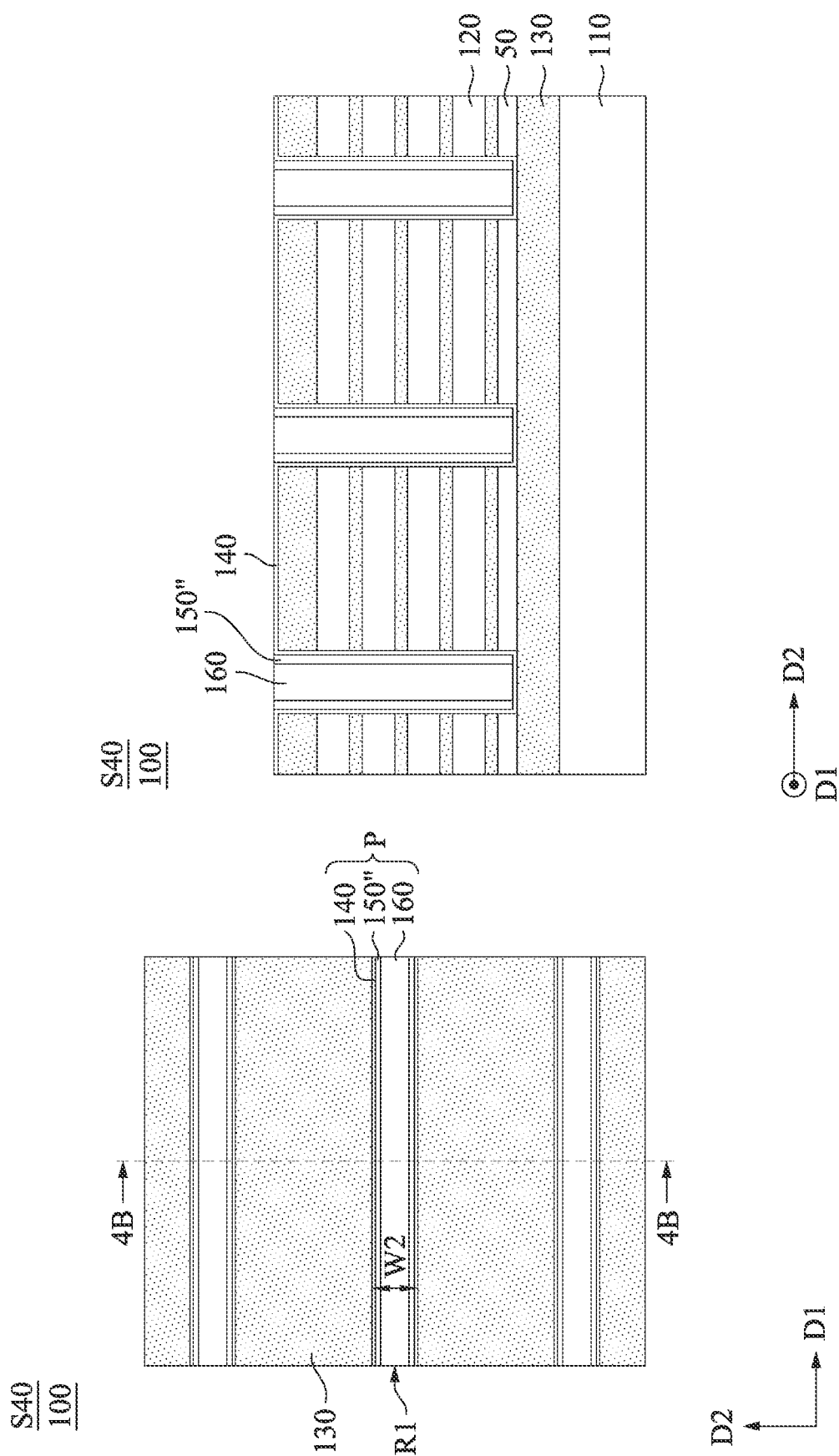

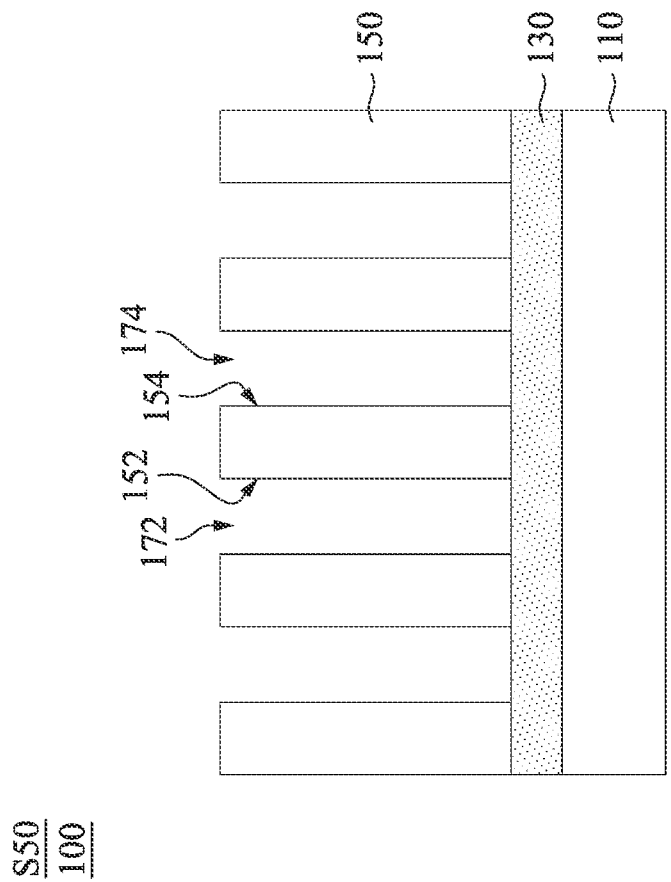
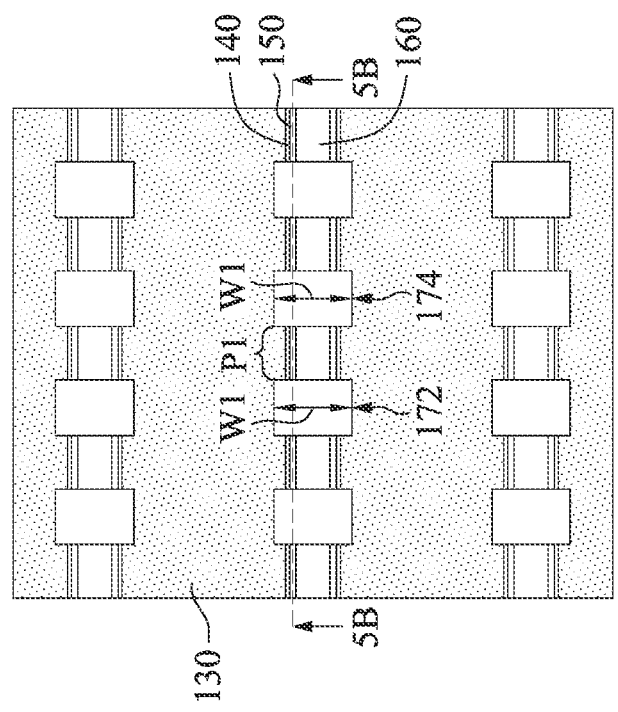
Fig. 5A
Fig. 5B

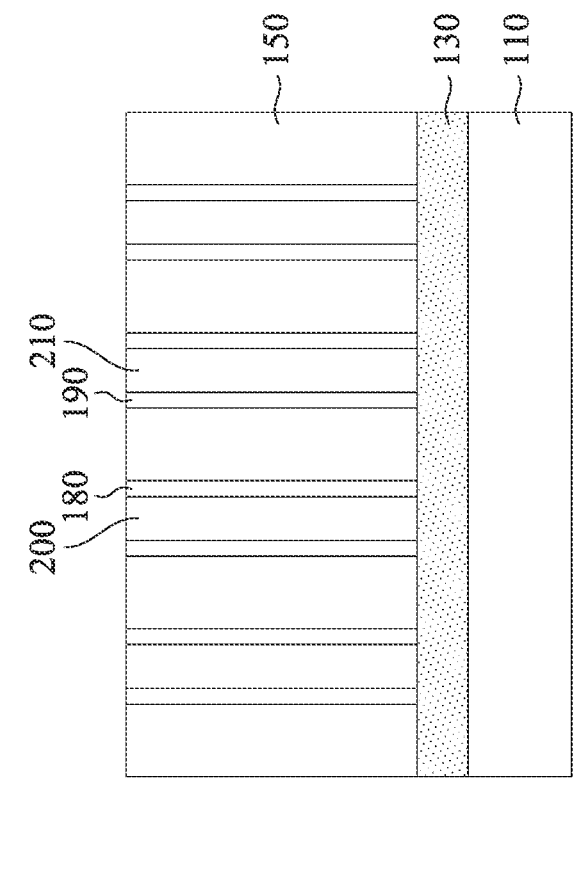
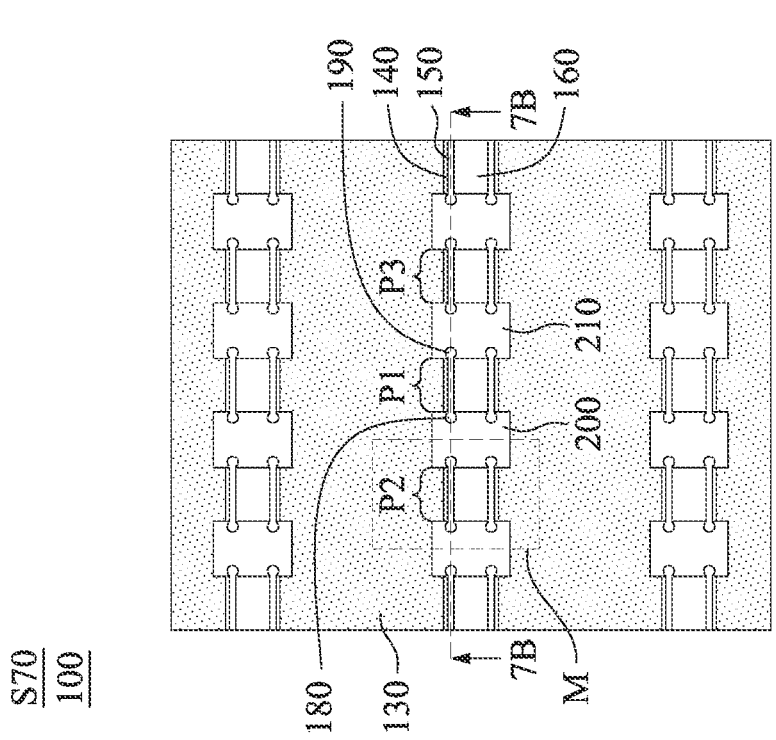
Fig. 7A
Fig. 7B

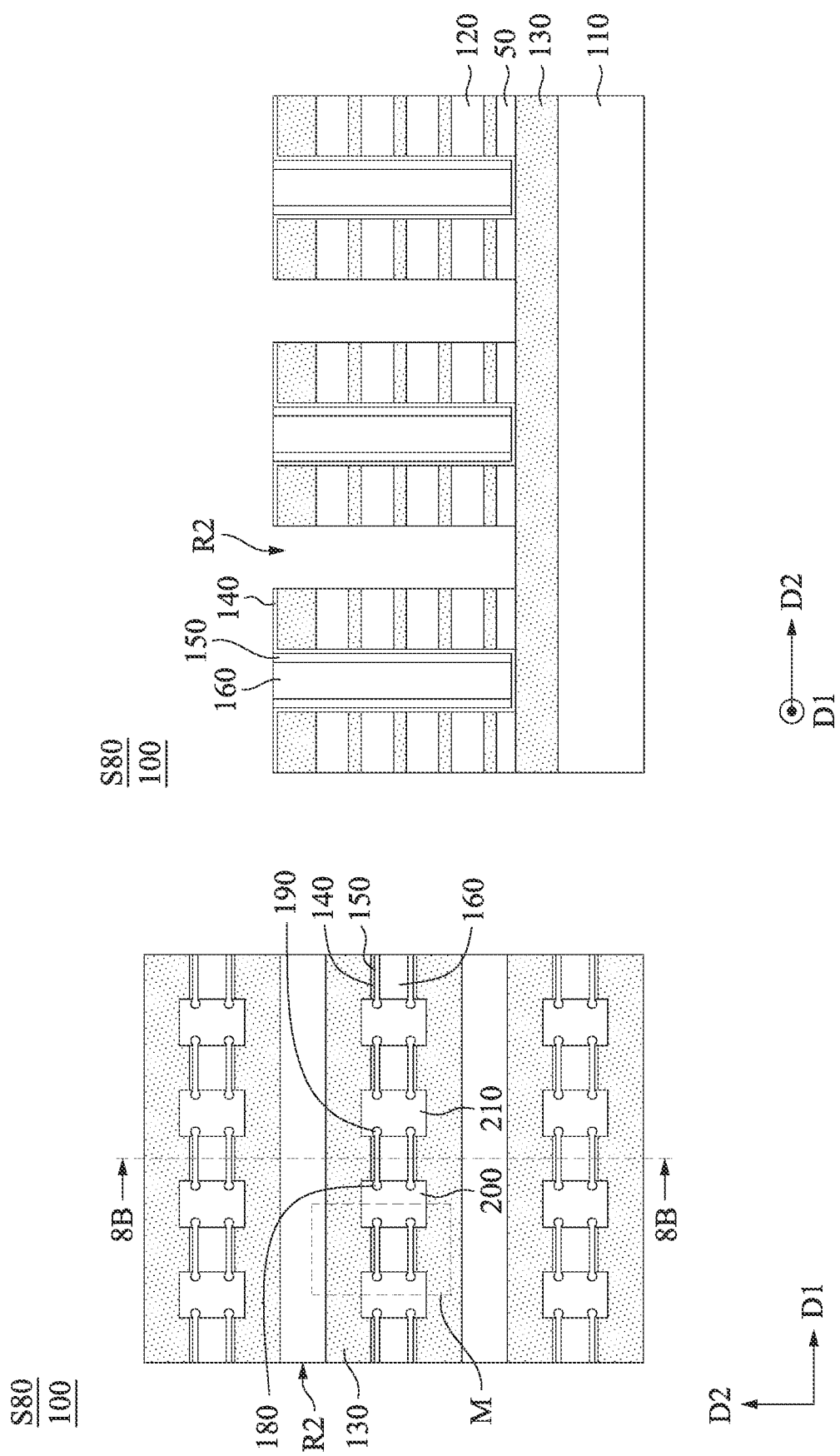

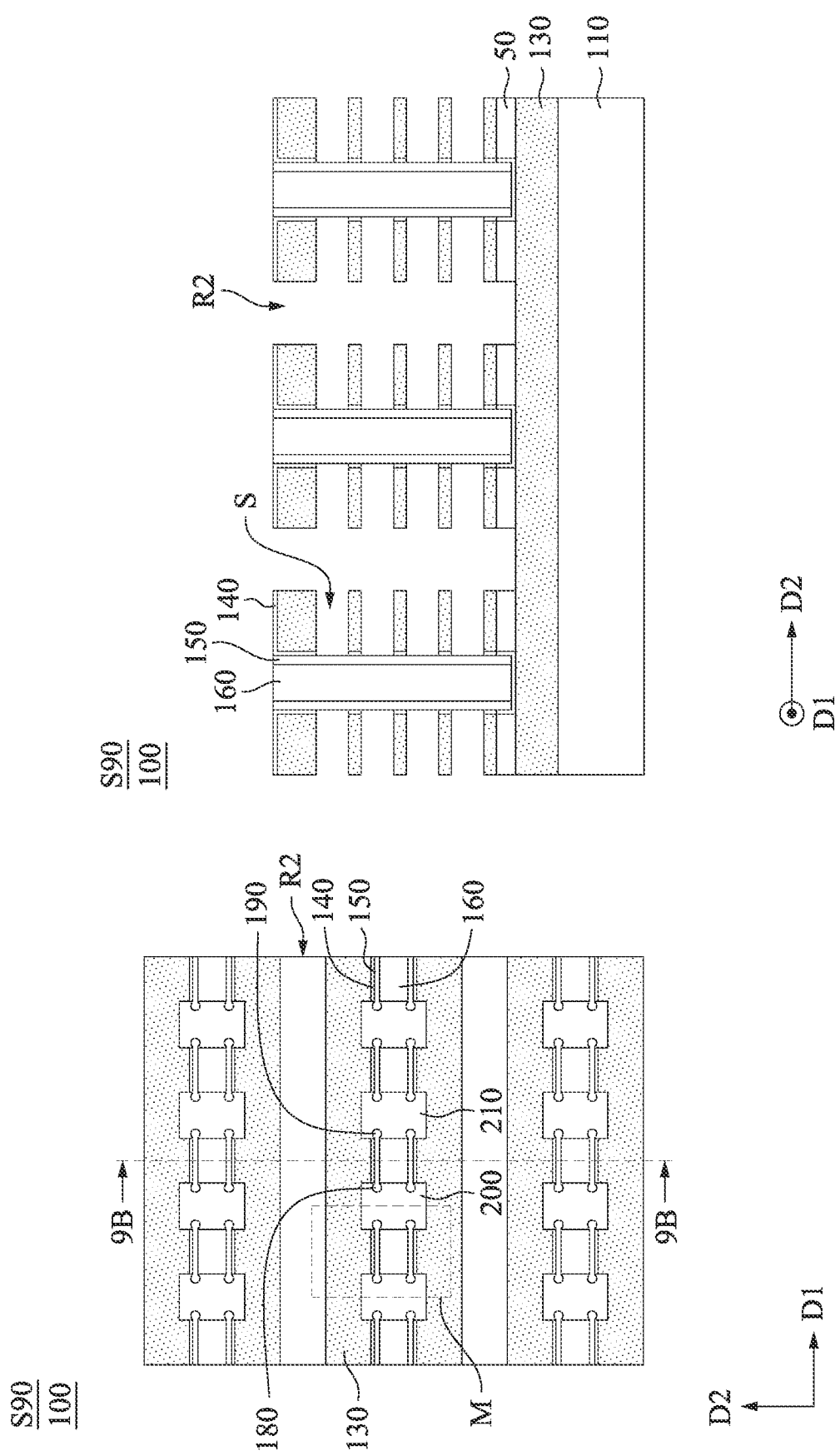

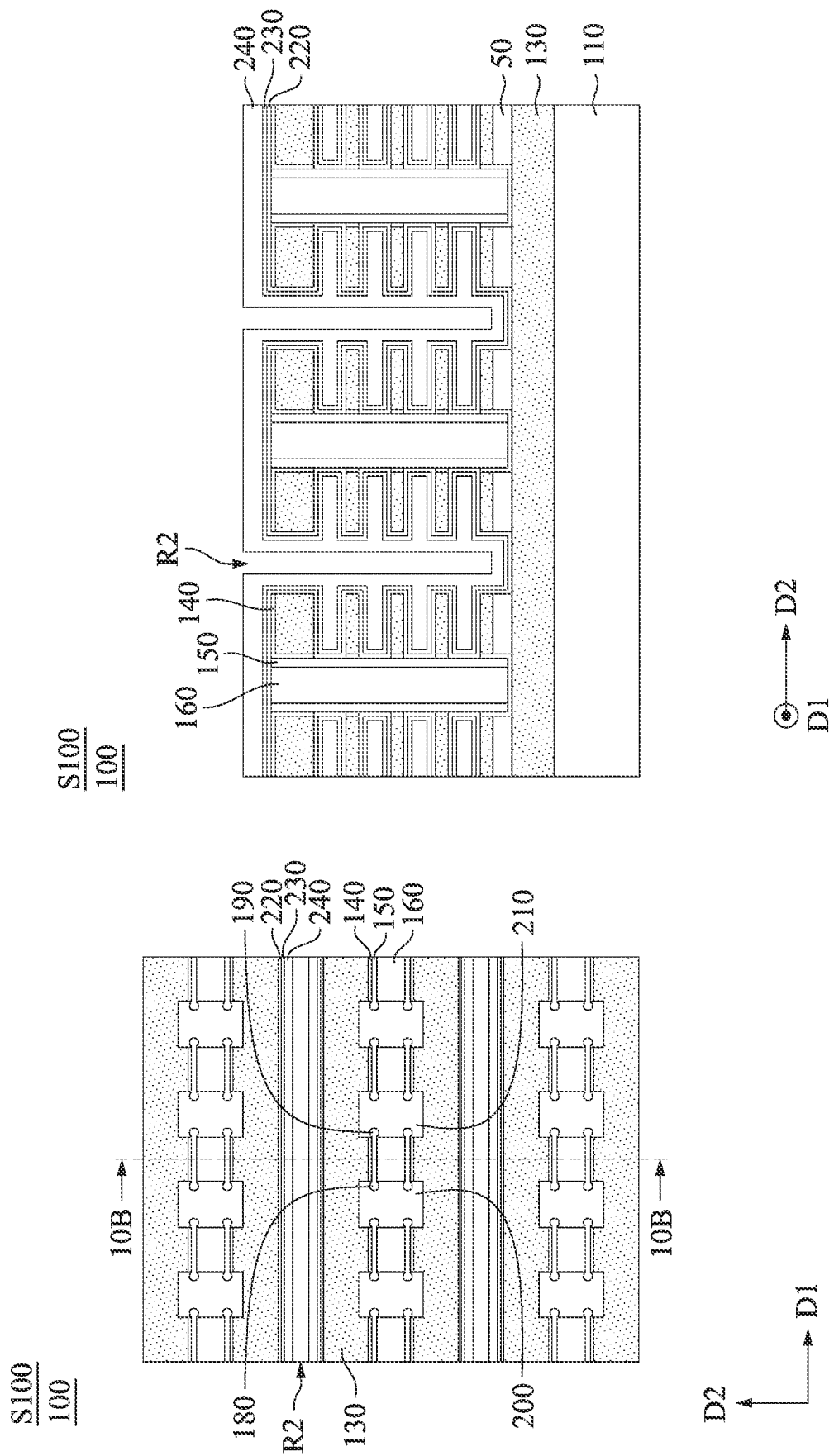

MANUFACTURING METHOD OF MEMORY DEVICE

CROSS-REFERENCE TO RELATED APPLICATION

The present application is a Divisional Application of the U.S. application Ser. No. 17/088,650, filed Nov. 4, 2020.

BACKGROUND

Field of Invention

The present disclosure relates to a manufacturing method of the memory device.

Description of Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof are in need. In addition, the alignment of the source/drain may also be critical to improve the critical dimension of the memory device.

SUMMARY

The disclosure relates in general to a memory device and a manufacturing method of the memory device.

According to some embodiments of the present disclosure, the memory device includes a substrate, a first dielectric structure, a second dielectric structure, a channel structure, a source structure, and a drain structure. The first dielectric structure and the second dielectric structure are disposed on the substrate, and are spaced apart from each other in a first direction. The channel structure interconnects the first dielectric structure and the second dielectric structure. The source structure and the drain structure are on opposite sides of the channel structure, and are respectively embedded in the first dielectric structure and the second dielectric structure, wherein a ratio in length along the first direction of the source structure to the first dielectric structure is between 0.3 and 0.4.

In some embodiments of the present disclosure, a ratio in length along the first direction of the drain structure to the second dielectric structure is between 0.3 and 0.4.

In some embodiments of the present disclosure, a length along the first direction of each of the source structure and the drain structure is between 50 nm and 100 nm.

In some embodiments of the present disclosure, a ratio in length along a second direction of the channel structure to each of the source structure and the drain structure is between 0.1 and 0.2, and the second direction is perpendicular to the first direction.

In some embodiments of the present disclosure, the channel structure is substantially in a rectangular shape in a top view, and each of the source structure and the drain structure is substantially in a circular shape in a top view.

In some embodiments of the present disclosure, the channel structure includes polysilicon, each of the source structure and the drain structure includes monocrystalline silicon, and an irregular interface is between the channel structure and each of the source structure and the drain structure.

In some embodiments of the present disclosure, the memory device further includes a memory structure layer and a conductive layer. The memory structure layer extends from a sidewall of the first dielectric structure to a sidewall of the second dielectric structure, in which the sidewall of the first dielectric structure faces toward the sidewall of the second dielectric structure. The conductive layer extends from the sidewall of the first dielectric structure to the sidewall of the second dielectric structure, in which the memory structure layer is between the channel structure and the conductive layer.

In some embodiments of the present disclosure, a vertical projection of the memory structure layer in the first direction partially overlaps a vertical projection of each of the source structure and the drain structure in the first direction.

In some embodiments of the present disclosure, a sidewall of the memory structure layer in contact with the sidewall of the first dielectric structure is substantially coplanar with a sidewall of the conductive layer in contact with the sidewall of the first dielectric structure.

In some embodiments of the present disclosure, the memory device further includes an isolation structure extending along a sidewall of the channel structure facing away from the memory structure layer.

According to some other embodiments of the present disclosure, the memory device includes a substrate, a plurality of conductive layers, a plurality of dielectric layers, a memory structure, a first dielectric structure, and a second dielectric structure. The conductive layers and the dielectric layers are interlaced and stacked on the substrate. The memory structure penetrates through the conductive layers and the dielectric layers. The memory structure includes two channel structures, two source structures, and two drain structures. The channel structures extends in parallel with each other, in which each of the channel structures has a first side and a second side facing away from each other. The source structures are respectively on the first sides of the channel structures. The drain structures are respectively on the second sides of the channel structures, in which the drain structures are substantially aligned with the source structures in a first direction. The first dielectric structure and the second dielectric structure are disposed on the substrate, and on opposite sides of the memory structure, in which the source structures and the drain structures are respectively embedded in the first dielectric structure and the second dielectric structure.

In some embodiments of the present disclosure, the memory device further includes a first isolation structure sandwiched between the channel structures.

In some embodiments of the present disclosure, the channel structures are substantially aligned with each other along a second direction perpendicular to the first direction.

In some embodiments of the present disclosure, the memory device further includes an isolation layer between the dielectric layers and the channel structures, in which a portion of each of the conductive layers is embedded in the isolation layer.

In some embodiments of the present disclosure, the memory device further includes a second isolation structure penetrating through the conductive layers and the dielectric layers, in which portions of the second isolation structure are sandwiched between the dielectric layers.

According to some other embodiments of the present disclosure, the manufacturing method of a memory device includes: forming a pillar structure on a substrate, in which the pillar structure includes a pair of channel layers extending in parallel along a first direction; forming a first trench and a second trench through the pillar structure, such that a pair of channel structures is formed, a first side of each of the channel structures is exposed from the first trench, and a second side of each of the channel structures is exposed from the second trench; and epitaxially growing a source structure on the first side of each of the channel structures and a drain structure on the second side of each of the channel structures, such that the drain structure is substantially aligned with the source structure in a first direction.

In some embodiments of the present disclosure, forming the first trench and the second trench is performed such that a width along a second direction of each of the first trench and the second trench is larger than a width along the second direction of the pillar structure, and the second direction is perpendicular to the first direction.

In some embodiments of the present disclosure, epitaxially growing the source structure and the drain structure is performed such that the source structure and the drain structure are respectively in the first trench and the second trench.

In some embodiments of the present disclosure, the manufacturing method of a memory device further includes: controlling a growing condition, such that a ratio in length along the first direction of the source structure to the first trench is between 0.3 and 0.4, and a ratio in length along the first direction of the drain structure to the second trench is between 0.3 and 0.4.

In some embodiments of the present disclosure, the manufacturing method of a memory device further includes: filling a dielectric material in the first trench and the second trench after epitaxially growing the source structure and the drain structure, such that a first dielectric structure and a second dielectric structure are respectively formed in the first trench and the second trench, and the source structure and the drain structure are respectively embedded in the first dielectric structure and the second dielectric structure.

In the aforementioned embodiments of the present disclosure, since the channel structures extend in parallel along a first direction, and the source structure and the drain structure are epitaxially grown on opposite sides of each of the channel structures, the alignment of the source structures in the same memory structure, the alignment of the drain structures in the same memory structure, and the alignment of the source structure and the drain structure on the same channel structure can be easily achieved. Furthermore, since the ratio in length of the source/drain structures to the first/second trenches is between 0.3 and 0.4, the growing of the source structure and the drain structure may not be restrained, and the alignment of the source/drain structures can further be well achieved.

BRIEF DESCRIPTION OF THE DRAWINGS

The disclosure can be more fully understood by reading the following detailed description of the embodiments, with reference made to the accompanying drawings as follows:

FIGS. 1A, 2A, 3A, 4A, 5A, 6A, 7A, 8A, 9A, 10A, 11A, and 12A are top views of a process at various stages of a manufacturing method of a memory device according to some embodiments of the present disclosure;

FIGS. 1B, 2B, 3B, 4B, 5B, 6B, 7B, 8B, 9B, 10B, 11B and 12B are cross-sectional views of a process at various stages of a manufacturing method of a memory device according to some embodiments of the present disclosure;

DETAILED DESCRIPTION

Figure 6B:
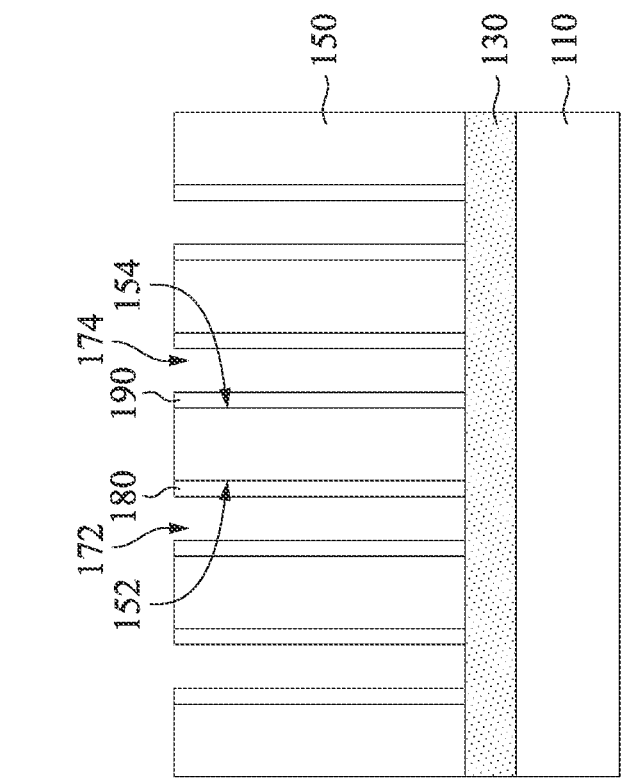

Reference will now be made in detail to the present embodiments of the disclosure, examples of which are illustrated in the accompanying drawings. Wherever possible, the same reference numbers are used in the drawings and the description to refer to the same or like parts.

As used herein, "around", "about", "approximately", or "substantially" shall generally mean within 10 percent, or within 5 percent of a given value or range. Numerical quantities given herein are approximated, meaning that the term "around", "about", "approximately", or "substantially" can be inferred if not expressly stated.

In the embodiments of the present disclosure, a memory device and a manufacturing method of the same are provided. For the purpose of simplicity and clarity, the manufacturing method of the memory device will be discussed first in the article. Furthermore, the term "top view" may be used herein for ease of description to refer to as a cross-sectional view of the topmost dielectric layer (i.e., the cross-section along line a-a' in FIG. 2B) of the memory device in order to highlight the technical features of the inventive concept. FIGS. 1A-1B, 2A-2B, 3A-3B, 4A-4B, 5A-5B, 5A-5B, 6A-6B, 7A-7B, 8A-8B, 9A-9B, 10A-10B, 11A-11B, and 12A-12B are views of a process at various stages of a manufacturing method of a memory device 100 according to some embodiments of the present disclosure.

Reference is made to FIGS. 1A and 1B, in which FIG. 1A is a top view of step S10 of forming the memory device 100, and FIG. 1B is a cross-sectional view taken along line 1B-1B in FIG. 1A. In step S10, a substrate 110 is provided, and a plurality of insulating layers 120 and a plurality of dielectric layers 130 are interlaced and stacked on the substrate 110, and extend along a plane formed by a first direction D1 and a second direction D2, in which the first direction D1 is perpendicular to the second direction D2. In some embodiments, a gate poly layer 50 may be formed on the bottommost dielectric layer 130, and the gate poly layer 50 may also extend along a plane formed by the first direction D1 and the second direction D2. The gate poly layer 50 may be made of a material including polysilicon and serve as an etching stop layer for the formation of recesses, which will be discussed later in the following descriptions. In some embodiments, a thickness T1 of the insulating layers 120 may be larger than a thickness T2 of the dielectric layers 130, and the bottommost dielectric layer 130 may have a thickness T3 lager than a thickness T2 of the other dielectric layers 130 disposed thereon. In some embodiments, the insulating layers 120 may be made of a material including nitride, and the dielectric layers 130 may be made of a material including oxide, but the present disclosure is not limited in this regard.

Reference is made to FIGS. 2A and 2B, in which FIG. 2A is a top view of step S20 of forming the memory device 100, and FIG. 2B is a cross-sectional view taken along line 2B-2B in FIG. 2A. After the stacked layers are provided on the substrate 110, a first recesses R1 is then formed. In detail, the first recess R1 penetrates through the insulating layers 120 and the dielectric layers 130. As mentioned above, the gate poly layer 50 may serve as an etching stop layer for the formation of the first recess R1, such that the first recess R1 stops below the gate poly layer 50. As shown in FIG. 2A, the first recess R1 has a rectangular profile in a top view, and the rectangular first recess R1 extends along the first direction D1. In some embodiments, a plurality of the first recesses R1 can be formed in parallel with each other along the first direction D1, for example, three first recesses R1 may be arranged along the second direction D2 at intervals, and each of the first recesses R1 extends along the first direction D1 (as shown in FIG. 2A). After the first recess R1 is formed, an isolation layer 140 is conformally formed in the first recess R1 and on the topmost dielectric layer 130. In detail, the isolation layer 140 is disposed on sidewalls of the insulating layers 120 and the dielectric layers 130 and on a top surface of the topmost dielectric layer 130, and covers a bottom surface of the first recess R1. In some embodiments, the isolation layer 140 may be made of a material including oxide, but the present disclosure is not limited in this regard.

Reference is made to FIGS. 3A and 3B, in which FIG. 3A is a top view of step S30 of forming the memory device 100, and FIG. 3B is a cross-sectional view taken along line 3B-3B in FIG. 3A. A pair of channel layers 150" is then conformally formed along the opposite sidewalls of the isolation layer 140 in the first recess R1. In detail, a material of the channel layers 150" may first be conformally formed on a whole surface of the isolation layer 140, and then a blanket etching process is performed such that a portion of the material of the channel layers 150" on the top surface of the topmost dielectric layer 130 and a portion of the material of the channel layers 150" on the bottom of the first recess R1 are removed, thereby exposing a portion of the isolation layer 140 on the top surface of the topmost dielectric layer 130 and a portion of the isolation layer 140 on the bottom of the first recess R1. As a result, a pair of channel layers 150" is formed in the first recess R1 and extending along the first direction D1. In some embodiments, the channel layers 150" may be made of a material including polysilicon.

Reference is made to FIGS. 4A and 4B, in which FIG. 4A is a top view of step S40 of forming the memory device 100, and FIG. 4B is a cross-sectional view taken along line 4B-4B in FIG. 4A. A first isolation structure 160 is disposed between the channel layers 150" to fill the first recess R1 and in contact with a bottom portion of the isolation layer 140. In some embodiments, a planarization process such as a chemical-mechanical polishing (CMP) process may be performed to remove the material of the first isolation structure 160 which is exceeded outside the first recess R1. In some embodiments, the first isolation structure 160 may be made of a material including oxide, but the present disclosure is not limited in this regard. After the formation of the first isolation structure 160, a pillar structure P including the isolation layer 140, the pair of channel layers 150", and the first isolation structure 160 is formed. When a plurality of the first recesses R1 are formed in parallel with each other along the first direction D1 in step S20, a plurality of the pillar structures P with each having a rectangular profile in a top view may be formed in parallel with each other along the first direction D1 in this step. The pillar structure P has a width W2 (see FIG. 4A) along the second direction D2.

Reference is made to FIGS. 5A and 5B, in which FIG. 5A is a top view of step S50 of forming the memory device 100, and FIG. 5B is a cross-sectional view taken along line 5B-5B in FIG. 5A. After the pillar structure P (see FIG. 4A) is formed, a first trench 172 and a second trench 174 may be formed to penetrate through the pillar structure P (see FIG. 4A). In some embodiments, the first trench 172 is formed adjacent the second trench 174 along the first direction D1.

It is noted that the first trench 172 and the second trench 174 labelled in FIGS. 5A and 5B are merely examples, and any two trenches which are adjacent to each other along the direction D1 can be regarded as the first trench 172 and the second trench 174 referred hereinafter. In some embodiments, each of the first trench 172 and the second trench 174 has a rectangular profile in a top view, in which two sides of each of the first trench 172 and the second trench 174 are parallel to two sides of the pillar structure P (see FIG. 4A). In some embodiments, a width W1 of each of the first trench 172 and the second trench 174 along the second direction D2 is larger than the width W2 of the pillar structure P (see FIG. 4A) along the second direction D2. Accordingly, the pillar structure P is cut off into a plurality of segmented pillar structures P1 by the first trench 172 and the second trench 174. Stated differently, the trenches (including the first trench 172 and the second trench 174) and the segmented pillar structures P1 are alternately arranged along the first direction D1. In addition, after the first trench 172 and the second trench 174 are formed, each of the channel layers 150" (see FIG. 4A) is cut off into at least one channel structure 150, and each of the segmented pillar structures P1 may include two channel structures 150 extending along the first direction D1 and substantially aligned with each other along the second direction D2. In each of the segmented pillar structures P1, each of the channel structures 150 is substantially in a rectangular shape in a top view, and each of the channel structures 150 has a first side 152 exposed from the first trench 172 and a second side 154 opposite to the first side 152 and exposed from the second trench 174.

Figure 6A:
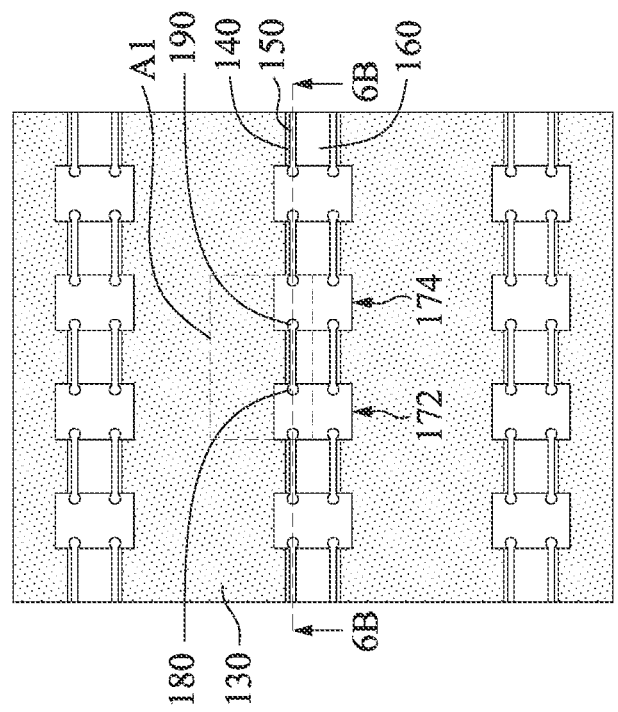

Reference is made to FIGS. 6A and 6B, in which FIG. 6A is a top view of step S60 of forming the memory device 100, and FIG. 6B is a cross-sectional view taken along line 6B-6B in FIG. 6A. A source structure 180 and a drain structure 190 are then epitaxially grown from the first side 152 and the second side 154 of each of the channel structures 150, respectively. During the epitaxial growth, a material of the source structure 180 progressively grows from the first side 152 of the channel structure 150 into the first trench 172, and the drain structure 190 progressively grows from the second side 154 of the channel structure 150 into the second trench 174. As mentioned above in step S50, since the width W1 (see FIG. 5A) of each of the first trench 172 and the second trench 174 along the second direction D2 is larger than the width W2 of the pillar structure P (see FIG. 4A) along the second direction D2, spaces are ensured to be preserved for the growth of the source structure 180 and the drain structure 190. Accordingly, the growth of source structure 180 and the drain structure 190 may not be restrained by the first trench 172 and the second trench 174, and hence the source structure 180 and the drain structure 190 can grow into a desired shape and be formed in a desired position, such that the alignment of the source structure 180 and the drain structure 190 can be easily achieved. For example, the source structure 180 and the drain structure 190 respectively on the first side 152 and the second side 154 of the same channel structure 150 are substantially aligned with each other in the first direction D1, the source structures 180 on different channel structures 150 in the same trench (i.e., the first trench 172) are substantially aligned with each other in the second direction D2, and the drain structures 190 on different channel structures 150 in the same trench (i.e., the second trench 174) are substantially aligned with each other in the second direction D2.

Figure 6C:
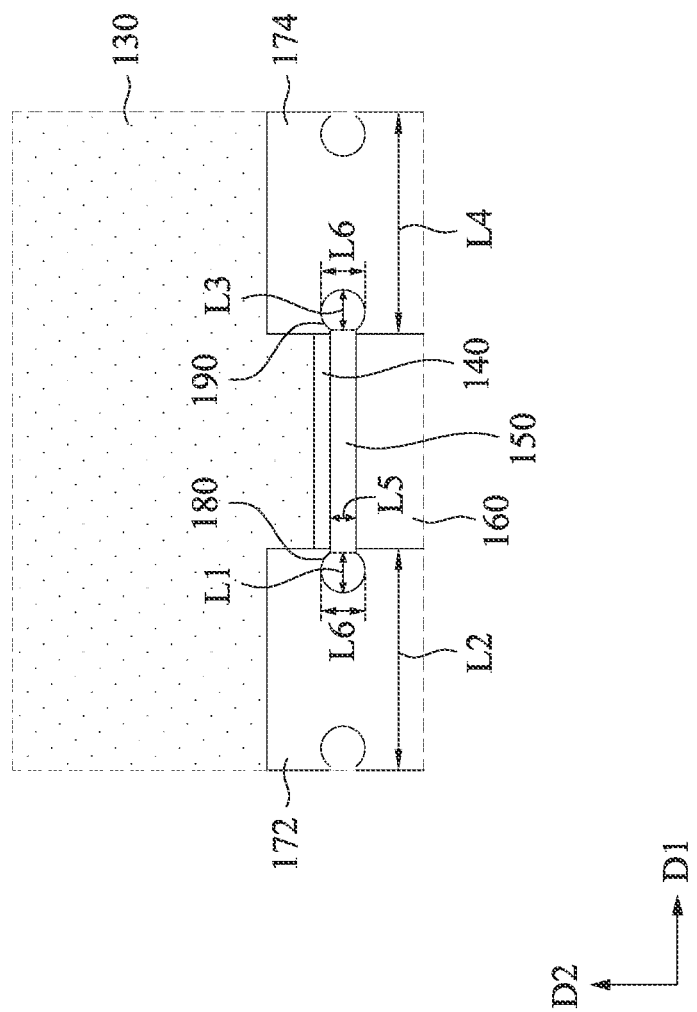
FIG. 6C is a partial enlargement diagram of the region A1 shown in FIG. 6A.

Reference is made to FIG. 6C, which is a partial enlargement diagram of the region A1 shown in FIG. 6A. In some embodiments, a growing condition may be controlled, such that the a ratio in length along the first direction D1 of the source structure 180 to the first trench 172 (i.e., a ratio of a length L1 of the source structure 180 to a length L2 of the first trench 172 along the first direction D1) is between 0.3 and 0.4, and a ratio in length along the first direction D1 of the drain structure 190 to the second trench 174 (i.e., a ratio of a length L3 of the drain structure 190 to a length L4 of the second trench 174 along the first direction D1) is between 0.3 and 0.4. When such a ratio is in the above range, the source structure 180 and the adjacent drain region 190 in the same trench can be prevented from contacting each other in order to avoid short circuited, and the resistance of the source structure 180 and the drain region 190 can be controlled in a desired value. In detail, if the aforementioned ratio is larger than 0.4, the length of each of the first trench 172 and the second trench 174 is not large enough for the growth of the source structure 180 and the drain region 190, thereby leading to a contact between the source structure 180 and the drain region 190; and if the aforementioned ratio is smaller than 0.3, the size of each of the source structure 180 and the drain region 190 may be too small, and hence the resistance of the source structure 180 and the drain region 190 may not be well controlled in a desired value.

In some embodiments, each of the length L1 of the source structure 180 and the length L3 of the drain structure 190 along the first direction D1 is between 50 nm and 100 nm, such that the resistance of each of the source structure 180 and the drain structure 190 can reach to a desired value, and the dimension of the memory device 100 can be maintain in an appropriate range. In detail, if each of the length L1 of the source structure 180 and the length L3 of the drain structure 190 is smaller than 50 nm, the size of each of the source structure 180 and the drain region 190 may be too small to reach the desired value of its resistance; and if each of the length L1 of the source structure 180 and the length L3 of the drain structure 190 is larger than 100 nm, the size of the memory device 100 may be difficult to reduce. In some embodiments, a ratio in length along the second direction D2 of the channel structure 150 to each of the source structure 180 and the drain structure 190 (i.e., a ratio of a length L5 of the channel structure 150 to a length L6 of each of the source structure 180 and the drain structure 190 along the second direction D2) is between 0.1 and 0.2. In detail, if the aforementioned ratio is smaller than 0.1, the alignment of the source structure 180 and the drain structure 190 may be difficult to achieve; and if the aforementioned ratio is larger than 0.2, the size of each of the source structure 180 and the drain structure 190 may be too small to reach the desired value of its resistance.

In some embodiments, the growing condition may be well controlled such that each of the source structure 180 and the drain structure 190 is substantially in a circular shape in a top view. Accordingly, a channel structure 150 in combination with the source and drain structures 180, 190 on opposite sides thereof has a "dumbbell-like" or a "bone-like" shape in a top view. In some embodiments, a material of the channel structure 150 may be different from a material of each of the source structure 180 and the drain structure 190. For example, the channel structure 150 is made of a material including polysilicon, and each of the source structure 180 and the drain structure 190 is made of a material including monocrystalline silicon.

Reference is made to FIGS. 7A and 7B, in which FIG. 7A is a top view of step S70 of forming the memory device 100, and FIG. 7B is a cross-sectional view taken along line 7B-7B in FIG. 7A. After the source structure 180 and the drain structure 190 are formed, a dielectric material is filled in the first trench 172 and the second trench 174 (see FIG. 6A). In some embodiments, a planarization process such as a chemical-mechanical polishing (CMP) process may be performed to remove the dielectric material which is exceeded outside the first trench 172 and the second trench 174 (see FIG. 6A). Accordingly, a first dielectric structure 200 and a second dielectric structure 210 are respectively formed in the first trench 172 and the second trench 174 (see FIG. 6A). In addition, the source structures 180 grown from the same segmented pillar structure P1 are embedded in the first dielectric structure 200, while the drain structures 190 grown from the same segmented pillar structure P1 are embedded in the second dielectric structure 210. It is noted that when a plurality of the trenches (including the first trenches 172 and the second trenches 174) are arranged along the first direction D1, the source structures 180 grown from one segmented pillar structure P1 and the drain structures 190 grown from the adjacent segmented pillar structure P2 may be embedded in the same first dielectric structure 200, and the drain structures 190 grown from one segmented pillar structure P1 and the source structures 180 grown from the adjacent segmented pillar structure P3 may be embedded in the same second dielectric structure 210. Furthermore, the first isolation structure 160 is sandwiched between the first dielectric structure 200 and the second dielectric structure 210 along the first direction D1, and is sandwiched between the channel structures 150 along the second direction D2. After the first dielectric structure 200 and the second dielectric structure 210 are formed, a memory structure M including two channel structures 150, two source structures 180, two drain structures 190, the first isolation structure 160, a portion of the first dielectric structure 200, and a portion of the second dielectric structure 210 is formed.

In more detail, the memory structure M may include two channel structures 150, two source structures 180, and two drain structures 190. The two channel structures 150 extends in parallel with each other, and each of the channel structures 150 has a first side 152 and a second side 154 facing away from each other. The two source structures 190 are respectively on the first sides 152 of the channel structures 150, and the two drain structures 190 are respectively on the second sides 154 of the channel structures 150. In some embodiments, the drain structures 190 are substantially aligned with the source structures 180 in the first direction D1.

Reference is made to FIGS. 8A and 8B, in which FIG. 8A is a top view of step S80 of forming the memory device 100, and FIG. 8B is a cross-sectional view taken along line 8B-8B in FIG. 8A. A second recess R2 is then formed adjacent the memory structure M along the second direction D2. In some embodiments, the second recess R2 penetrates through the insulating layers 120 and the dielectric layers 130. As mentioned above, the gate poly layer 50 may serve as an etching stop layer for the formation of the second recess R2, such that the second recess R2 stops below the gate poly layer 50. As shown in FIG. 8A, the second recess R2 has a rectangular profile in a top view, and the rectangular second recess R2 extends along the first direction D1. In some embodiments, the second recess R2 may be formed between two memory structures M along the second direction D2, and extends in parallel with the memory structures M. In some embodiments, a plurality of the memory structures M and a plurality of the second recesses R2 may be arranged alternately along the second direction D2 at intervals.

Reference is made to FIGS. 9A and 9B, in which FIG. 9A is a top view of step S90 of forming the memory device 100, and FIG. 9B is a cross-sectional view taken along line 9B-9B in FIG. 9A. The insulating layers 120 between the dielectric layers 130 are then being removed by a selective etching process. In some embodiments, the selective etching process may be a chemical etching process in hot phosphoric acid removing the insulating layers 120 (see FIG. 9B) which may be made of a material including silicon nitride. In the meanwhile, the dielectric layers 130 and the memory structures M are well preserved. After the removal of the insulating layers 120 (see FIG. 9B) by the selective etching process, a plurality of spaces S are formed between the dielectric layers 130, and portions of the isolation layer 140 in the spaces S are then removed, such that portions of the channel structure 150 are exposed from the spaces S.

Reference is made to FIGS. 10A and 10B, in which FIG. 10A is a top view of step S100 of forming the memory device 100, and FIG. 10B is a cross-sectional view taken along line 10B-10B in FIG. 10A. A memory structure layer 220 and a high-k dielectric layer 230 are then conformally formed on a top surface of the memory device 100, between the dielectric layers 130 (i.e., in the spaces S, see FIG. 9B), exposed portions of the channel structures 150, and in the second recess R2 Then, a conductive layer 240 is disposed on the high-k dielectric layer 230 to fill the spaces S, thereby resulting in a replacement of the insulating layers 120 (see FIG. 8B) with the memory structure layer 220, the high-k dielectric layer 230, and the conductive layer 240. In some embodiments, the memory structure layer 220 may include a blocking layer, a memory storage layer, and a tunneling layer (not shown), in which the blocking layer is directly in contact with the exposed portions of the channel structure 150 and in contact with portions of the isolation layer 140, the memory storage layer is disposed on the blocking layer, and the tunneling layer is disposed on the memory storage layer. In other words, the memory structure layer 220 is directly in contact with the exposed portions of the channel structure 150. The blocking layer and the tunneling layer may be made of a material including silicon oxide or other dielectric, and the memory storage layer may be made of a material including silicon nitride or other material that is able to trap electrons. In some embodiments, the high-k dielectric layer 230 may be made of a material including aluminum oxide or other dielectric. In some embodiments, the conductive layer 240 may be disposed by a chemical vapor deposition (CVD) process, and the conductive layer 240 may be made of a material including tungsten or other metal.

Figures 11A, 11B:
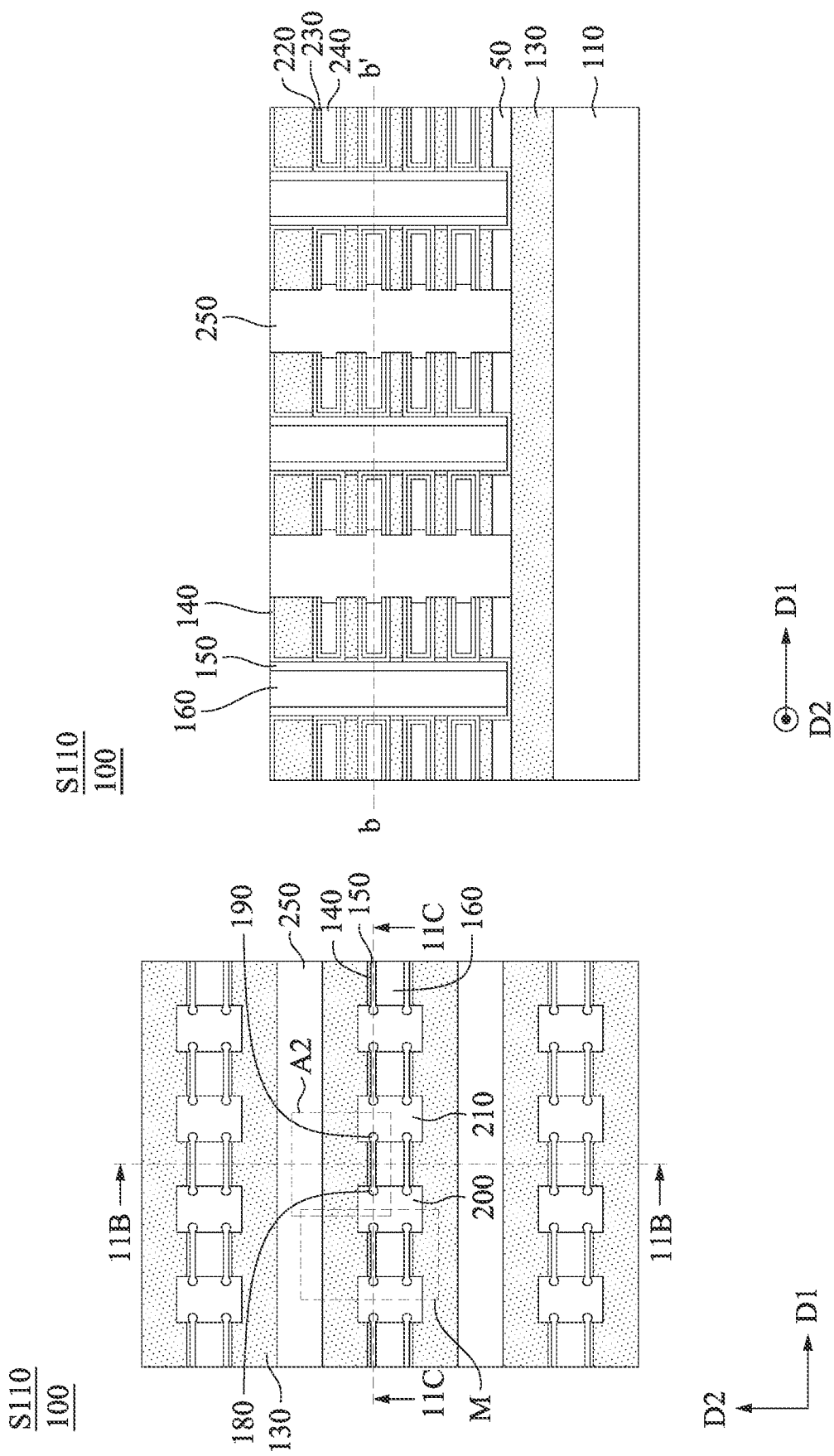

Reference is made to FIGS. 11A and 11B, in which FIG. 11A is a top view of step S110 of forming the memory device 100, and FIG. 11B is a cross-sectional view taken along line 11B-11B in FIG. 11A. Portions of the memory structure layer 220, the high-k dielectric layer 230, and the conductive layer 240 in the second recess R2 (see FIG. 10B) and on the top surface of the memory device 100 are then removed, such that the memory structure layer 220, the high-k dielectric layer 230, and the conductive layer 240 are exposed from the second recess R2 (see FIG. 11B). In some embodiments, the conductive layer 240 may further be etched back into the spaces S (see FIG. 9B) by about 15 nm to 20 nm of the depth, such that the conductive layer 240 is indented from the memory structure layer 220 and the high-k dielectric layer 230. After that, a second isolation structure 250 is entirely filled in the second recess R2 and protrudes into the spaces S (see FIG. 9B) such that portions of the second isolation structure 250 are sandwiched between the dielectric layers 130 in a vertical direction (i.e., a direction perpendicular to the first direction D1 and the second direction D2). After step S110 is performed, the second isolation structure 250 is formed penetrating through the conductive layers 240 and the dielectric layers 130.

Figure 11C:
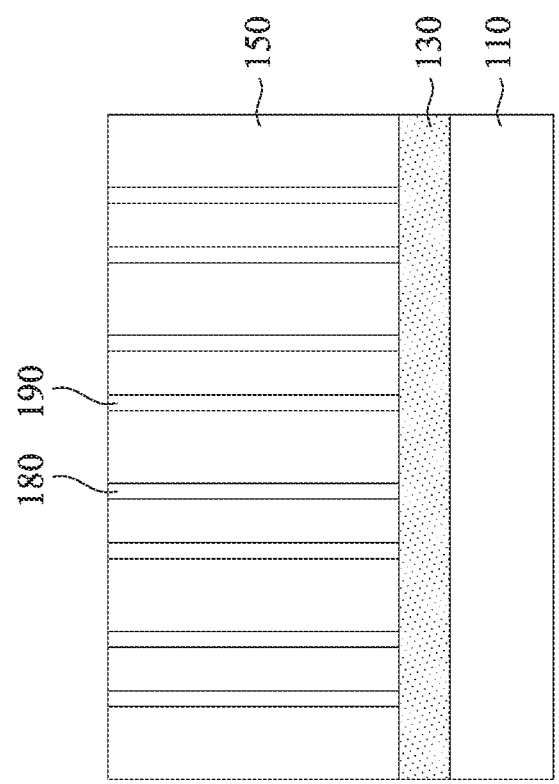
FIG. 11C is a cross-sectional view taken along line 11C-11C in FIG. 11A.
Figure 11D:
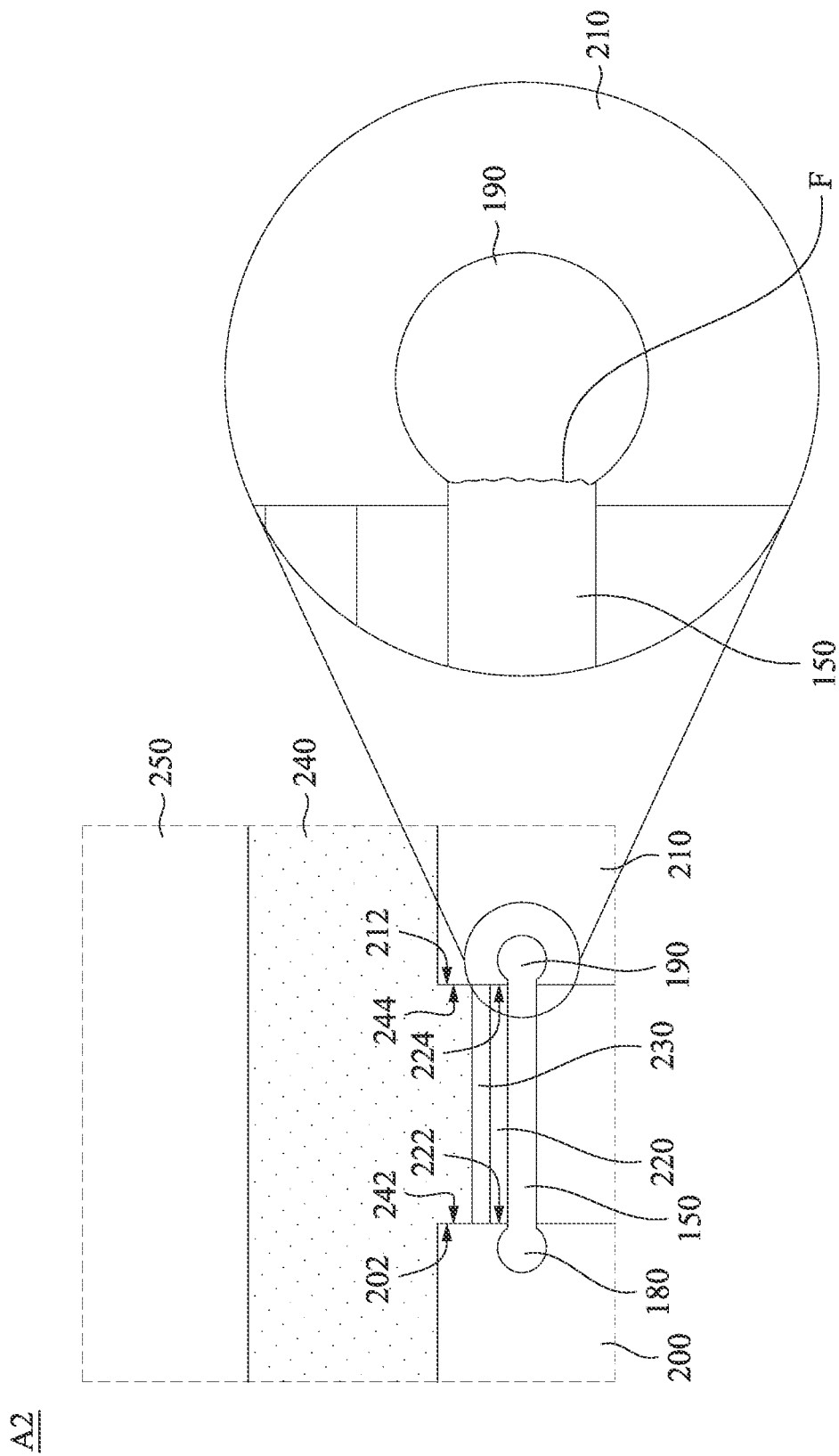
FIG. 11D is a partial enlargement perspective diagram of the region A2 shown in FIG. 11A.

FIG. 11C is a cross-sectional view taken along line 11C-110 in FIG. 11A. FIG. 11D is a partial enlargement perspective diagram of the region A2 shown in FIG. 11A, in which the perspective level of the region A2 is identical to the line b-b' shown in FIG. 11B. Reference is made to FIG. 11A to FIG. 11D. It is shown in FIG. 11B to FIG. 11D that the memory device 100 includes a substrate 110, a first dielectric structure 200, a second dielectric structure 210, a channel structure 150, a source structure 180, and a drain structure 190. The first dielectric structure 200 and the second dielectric structure 210 are disposed on the substrate 110, and are spaced apart from each other in the first direction D1. The first dielectric structure 200 and the second dielectric structure 210 are on opposite sides of the memory structure M which penetrates through the conductive layers 240 and the dielectric layers 130, in which the source structures 180 and the drain structures 190 are respectively embedded in the first dielectric structure 210 and the second dielectric structure 220. The channel structure 150 interconnects the first dielectric structure 200 and the second dielectric structure 210. The source structure 180 and the drain structure 190 are on opposite sides (ends) of the channel structure 150, and are respectively embedded in the first dielectric structure 200 and the second dielectric structure 210. As shown in FIG. 11D, the memory structure layer 220 and the high-k dielectric layer 230 extend from a sidewall 202 of the first dielectric structure 200 to a sidewall 212 of the second dielectric structure 210, in which the sidewall 202 of the first dielectric structure 200 faces toward the sidewall 212 of the second dielectric structure 210. In addition, the conductive layer 240 extends along the first direction D1 and has a portion protruding to be in contact with the sidewall 202 of the first dielectric structure 200, the sidewall 212 of the second dielectric structure 210, and the high-k dielectric layer 230. Stated differently, the conductive layer 240 has a portion extending from the sidewall 202 of the first dielectric structure 200 to the sidewall 212 of the second dielectric structure 210, such that the memory structure layer 220 is between the channel structure 150 and the conductive layer 240 along the second direction D2.

In some embodiments, a sidewall 222 of the memory structure layer 220 in contact with the sidewall 202 of the first dielectric structure 200 is substantially coplanar with a sidewall 242 of the conductive layer 240 in contact with the sidewall 202 of the first dielectric structure 200. Similarly, a sidewall 224 of the memory structure layer 220 in contact with the sidewall 212 of the second dielectric structure 210 is substantially coplanar with a sidewall 244 of the conductive layer 240 in contact with the sidewall 212 of the second dielectric structure 210. In addition, the first isolation structure 160 extends along a sidewall of the channel structure 180 facing away from the memory structure layer 220. In some embodiments, a vertical projection of the memory structure layer 220 in the first direction D1 partially overlaps a vertical projection of each of the source structure 180 and the drain structure 190 in the first direction D1. As shown in FIG. 11B, the isolation layer 140 is between the dielectric layers 130 and the channel structures 150. On the other hand, as shown in FIG. 11D, since the source structure 180 and the drain structure 190 are obtained by the epitaxial growth of the channel structure 150, and the material of the source structure 180 and the drain structure 190 is different from the material of the channel structure 150, an irregular interface F may exist between the channel structure 150 and each of the source structure 180 and the drain structure 190.

Figures 12A, 12B:
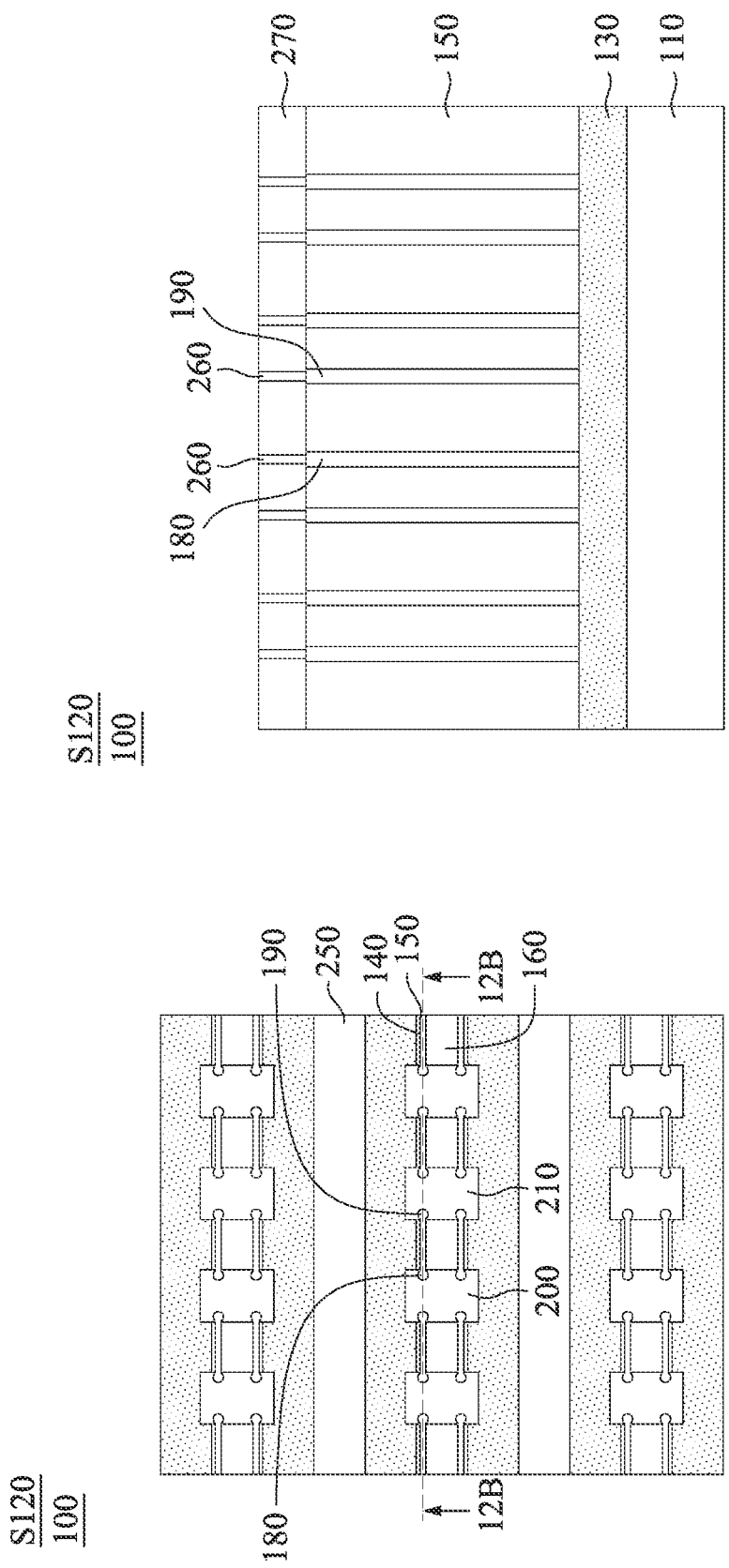

Reference is made to FIGS. 12A and 12B, in which FIG. 12A is a top view of step S120 of forming the memory device 100, and FIG. 12B is a cross-sectional view taken along line 12B-12B in FIG. 12A. In step S120, a contact 260 may be formed on each of the source structure 180 and the drain structure 190, such that the memory device 100 can be connected to word lines and/or bit lines for programming and erasing. In some embodiments, a dielectric layer 270 may be formed on the top of the memory device 100 before the contacts 260 are formed, in which the dielectric layer 270 may be made of a material identical to the material of the dielectric layer 130. As a result, the contacts 260 are formed in the dielectric layer 270 and electrically connected to the word lines and/or bit lines.

According to the aforementioned embodiments of the present disclosure, since the channel structures extend in parallel along a first direction, and the source structure and the drain structure are epitaxially grown on opposite sides of each of the channel structures, the alignment of the source structures in the same memory structure, the alignment of the drain structures in the same memory structure, and the alignment of the source structure and the drain structure on the same channel structure can be easily achieved. Furthermore, since the ratio in length of the source/drain structures to the first/second trenches is between 0.3 and 0.4, the growing of the source structure and the drain structure may not be restrained, and the alignment of the source/drain structures can further be well achieved. In addition, by controlling the growing condition of the source structure and the drain structure, the size of the source/drain structures can be in an appropriate range, such that the function of the memory device can be well improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A manufacturing method of a memory device, comprising:
    forming a pillar structure on a substrate, wherein the pillar structure comprises a pair of channel layers extending in parallel along a first direction;
    forming a first trench and a second trench through the pillar structure, such that a pair of channel structures is formed, a first side of each of the channel structures is exposed from the first trench, and a second side of each of the channel structures is exposed from the second trench; and
    epitaxially growing a source structure on the first side of each of the channel structures and a drain structure on the second side of each of the channel structures, such that the drain structure is substantially aligned with the source structure in the first direction.

2. The manufacturing method of the memory device of claim 1, wherein the first trench and the second trench are formed such that a width along a second direction of each of the first trench and the second trench is larger than a width along the second direction of the pillar structure, and the second direction is perpendicular to the first direction.

3. The manufacturing method of the memory device of claim 1, wherein the source structure and the drain structure are epitaxially grown such that the source structure and the drain structure are respectively in the first trench and the second trench.

4. The manufacturing method of the memory device of claim 1, further comprising:
    controlling a growing condition, such that a ratio in length along the first direction of the source structure to the first trench is between 0.3 and 0.4, and a ratio in length along the first direction of the drain structure to the second trench is between 0.3 and 0.4.

5. The manufacturing method of the memory device of claim 1, further comprising:
    filling a dielectric material in the first trench and the second trench after epitaxially growing the source structure and the drain structure, such that a first dielectric structure and a second dielectric structure are respectively formed in the first trench and the second trench, and the source structure and the drain structure are respectively embedded in the first dielectric structure and the second dielectric structure.

6. The manufacturing method of the memory device of claim 1, wherein the first trench and the second trench are formed through the pillar structure such that the pillar structure is cut off into a plurality of segmented pillar structures arranged along the first direction.

7. The manufacturing method of the memory device of claim 1, wherein a length along the first direction of each of the source structure and the drain structure is between 50 nm and 100 nm.

8. A manufacturing method of a memory device, comprising:
    forming a pillar structure on a substrate, wherein the pillar structure comprises a pair of channel layers extending in parallel along a first direction;
    forming a first trench and a second trench through the pillar structure, such that a pair of channel structures is formed; and
    epitaxially growing a source structure on a first side of each of the channel structures and a drain structure on a second side of each of the channel structures, such that the source structure and the drain structure are substantially in a circular shape in a top view.

9. The manufacturing method of the memory device of claim 8, further comprising:
    forming a plurality of insulating layers and a plurality of dielectric layers interlaced and stacked on the substrate.

10. The manufacturing method of the memory device of claim 9, wherein forming the pillar structure on the substrate comprises:
    forming a recess penetrating through the insulating layers and the dielectric layers;
    forming an isolation layer in the recess along sidewalls of the insulating layers and the dielectric layers; and
    forming the channel layers along sidewalls of the isolation layer.

11. The manufacturing method of the memory device of claim 10, wherein forming the pillar structure on the substrate comprises:
    filling an isolation structure in the recess after forming the channel layers.

12. The manufacturing method of the memory device of claim 8, further comprising:
    controlling a growing condition, such that a ratio in length along the first direction of the source structure to the first trench is between 0.3 and 0.4, and a ratio in length along the first direction of the drain structure to the second trench is between 0.3 and 0.4.

13. The manufacturing method of the memory device of claim 8, wherein a ratio in length along a second direction of each of the channel structures to the source structure and the drain structure is between 0.1 and 0.2, and the second direction is perpendicular to the first direction.

14. A manufacturing method of a memory device, comprising:
   forming a pair of channel layers extending in parallel along a first direction on a substrate;
   forming a trench through the channel layers, such that a pair of channel structures is formed; and
   epitaxially growing a source structure on a side of each of the channel structures, such that a ratio in length along the first direction of the source structure to the trench is between 0.3 and 0.4.

15. The manufacturing method of the memory device of claim 14, wherein the source structure is epitaxially grown such that the source structure is in the trench.

16. The manufacturing method of the memory device of claim 14, wherein a length along the first direction of the source structure is between 50 nm and 100 nm.

17. The manufacturing method of the memory device of claim 14, further comprising:
   forming a plurality of insulating layers and a plurality of dielectric layers interlaced and stacked on the substrate; and
   forming a recess penetrating through the insulating layers and the dielectric layers.

18. The manufacturing method of the memory device of claim 17, wherein the channel layers are formed in the recess.

19. The manufacturing method of the memory device of claim 14, further comprising:
   epitaxially growing a drain structure on another side of each of the channel structures, wherein the drain structure is substantially aligned with the source structure in the first direction.

20. The manufacturing method of the memory device of claim 14, further comprising:
   filling a dielectric material in the trench after epitaxially growing the source structure, such that a dielectric structure is formed in the trench, and the source structure is embedded in the dielectric structure.

* * * * *